United States Patent
Taylor et al.

(10) Patent No.: US 6,844,272 B2
(45) Date of Patent: Jan. 18, 2005

(54) CORRECTION OF LOCALIZED SHAPE ERRORS ON OPTICAL SURFACES BY ALTERING THE LOCALIZED DENSITY OF SURFACE OR NEAR-SURFACE LAYERS

(75) Inventors: John S. Taylor, Livermore, CA (US); James A. Folta, Livermore, CA (US); Claude Montcalm, Fort Collins, CO (US)

(73) Assignee: EUV Limited Liability Corporation, Santa Clara, CA (US)

( * ) Notice: Subject to any disclaimer, the term of this patent is extended or adjusted under 35 U.S.C. 154(b) by 4 days.

(21) Appl. No.: 10/086,922

(22) Filed: Mar. 1, 2002

(65) Prior Publication Data

US 2003/0164949 A1 Sep. 4, 2003

(51) Int. Cl.⁷ .............................................. H01L 21/31
(52) U.S. Cl. ...................................................... 438/787
(58) Field of Search ........................ 438/787; 204/192.27

(56) References Cited

U.S. PATENT DOCUMENTS 5,911,858 A * 6/1999 Ruffner ................. 204/192.27
6,607,991 B1 * 8/2003 Livesay et al. ............. 438/787

* cited by examiner

Primary Examiner—John F. Niebling
Assistant Examiner—Andre' Stevenson
(74) Attorney, Agent, or Firm—John P. Wooldridge; Alan H. Thompson

(57) ABSTRACT

Figure errors are corrected on optical or other precision surfaces by changing the local density of material in a zone at or near the surface. Optical surface height is correlated with the localized density of the material within the same region. A change in the height of the optical surface can then be caused by a change in the localized density of the material at or near the surface.

19 Claims, 1 Drawing Sheet

CORRECTION OF LOCALIZED SHAPE ERRORS ON OPTICAL SURFACES BY ALTERING THE LOCALIZED DENSITY OF SURFACE OR NEAR-SURFACE LAYERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing errors in the components produced by an extreme ultraviolet lithography (EUVL) system, and more specifically, it relates to a method and apparatus for repairing surface height errors on precision reflective optics.

2. Description of Related Art

The primary motivation of this invention is to enable the efficient correction of surface height errors on precision reflective optics. One of the limiting technologies is the fabrication of optical surfaces (mirrors) that are geometrically accurate to very stringent tolerances, about 0.1–0.2 nm rms. An important means of describing and/or categorizing these errors is the by their spatial scale, i.e. "how wide are they". The spatial scale of the figure errors relevant to this invention ranges from long-range errors such as astigmatism to millimeter-sized ripple. It is important to be able to address all of the spatial scales of the errors.

For lithographic optics, it is important to control the errors for all size ranges. One way to characterize the spatial sizes of the errors is to look at the Fourier transform of the errors. Beginning with a 3-D map of the surface indicating the height errors, the 2-D Fourier transform is calculated, and then the Power Spectral Density (PSD) is calculated. The PSD provides a measure of the error (rms power) in terms of spatial frequency or spatial period. For stringent lithographic applications, a need exists to control the height of the PSD for a very wide range of spatial periods, e.g., from 100 millimeters to 20 nanometers. This invention addresses the range from about 1 m to about 0.5 mm, which is often loosely termed the figure of the optic.

The problems with current fabrication processes are mainly that they cannot address this entire range of spatial periods, nor address sub-ranges without causing errors within other ranges. The current invention offers a unique opportunity to remove errors within the entire range termed figure or within sub-ranges of sizes without causing errors in other size ranges.

Current methods also cannot offer an effective way of removing waviness errors in the 1 mm range. The current invention offers a straightforward method of addressing the errors with a very small tool footprint that can naturally address such small range waviness.

The principal method currently used in the optical industry for fabricating precision optical surfaces is small tool polishing. This generally involves an abrasive slurry with some type of rotating or oscillating tool that causes the slurry to abrade the optical surface. In some cases, the slurry is chosen so that the main method of removing material is a chemical reaction. The tool acts to localize the activity of the chemical reaction by adding localized pressure or relative velocity. In other cases, the action of the slurry can be mechanical in that the slurry particles physically scrape away material. Often, the slurry polishing process is referred to as chemo-mechanical, indicating that it is a combination of chemical and mechanical material removal mechanisms. Small tool polishing is in current application in the lithographic optics industry.

The location of material removal for small tool polishing is determined by the localized pressure distribution provided by the polishing tool. This tool might comprise a pad on the end of a rotating spindle that contacts the workpiece with a controlled loading force. The specific geometry of the polishing pad and its orientation with respect to the surface typically comprise proprietary information. The specific choices of pad and slurry are also typically kept as proprietary information.

Other material removal mechanisms are also in use or have been considered. Ion beam figuring (IBF) involves sputtering away the surface atoms of an optical surface by ion impingement with sufficient energy to break chemical bonds. A geometrically well-controlled broad ion beam is created with an ion gun, often with a near gaussian profile. This beam is then scanned over the optic, leaving a path of material removal.

Another technique is plasma-assisted chemical etching, where a low energy plasma is generated near the optical surface. Reactant gases are fed into the plasma zone where chemically-reactive species are formed. These species react with the optical surface and form products that are then removed by the vacuum system. It is essential that the vapor pressure of the products is sufficiently high so that they will flow into the vacuum system for removal. In general, plasma-assisted chemical etching involves sufficiently low ion energies such that sputtering does not occur. Ion beam figuring requires ultra-high vacuum, while plasma etching requires only a mild vacuum.

Controlled deposition of surface layers is another technique that has been considered for correcting surface height errors. In this technique, a material such as silicon dioxide, is deposited on the surface to add height in areas that are deemed too low. The location of the deposition can be controlled by either placing a mask over the surface that only allows deposition through "open" areas, or by scanning a beam of deposition over the surface. In the latter case, the beam of deposition is analogous to the beam of removal mentioned above for ion beam figuring. The general type of equipment used for controlled deposition process is similar to equipment used for depositing coatings on optical elements.

Small tool polishing, ion figuring, plasma-assisted chemical etching, and controlled deposition are considered convolution processes. The location where removal (or addition) of the surface takes place is dictated by the location of the tool. The removal characteristics of the tool are described by a footprint function, which might be measured by simply letting the tool dwell at a location on the surface for a given period of time. A measurement of the resulting dimple in the material might reveal that the shape of the removal zone is gaussian, although other shapes may also be created. In general, the tool is planned to move over the optical surface and remove material, dwelling longer where more removal is required, less where less removal is required. The convolution concept is summarized such that the amount of removal at any one point on the surface is due to the sum of the removal contributions from all of the positions of the tool where the footprint overlapped with the point. There are relatively sophisticated mathematical algorithms to determine what path the tool should have over the part, and how long it should dwell at each location along its path.

There are several problems that have limited the above removal techniques from correcting errors in precision optics. First, it is difficult to address small-scale waviness because the footprint of the tool is generally larger than the 1 mm sized waviness that is part of the range of sizes that are of interest. Also, the control and stability of the shape of the footprint is not repeatable to the degree desired for precision removal.

Also, when addressing a broad range of spatial scales of errors, e.g., ranging from 1 mm to 100 mm waviness, different sized tools are used; larger tools are used for larger errors. It is observed in practice that when using a given size tool to address a given size error, that it often increases errors in other size ranges. Thus, the removal process often results in chasing the errors from one size range to another.

A particularly troublesome example of creating errors in another size range is in the fabrication of optics for EUV or x-ray optics. The surfaces of these optics require atomic level smoothness for spatial scales smaller than a micron (termed "microroughness"). In general, the final application of the above-mentioned removal processes shows a tendency to increase the roughness in the domain of these small scale errors. Thus, attaining acceptable levels of figure errors are typically attained at the expense of low levels of microroughness.

SUMMARY OF THE INVENTION

It is an object of the present invention to provide a method and apparatus for correcting surface errors on an optical substrate.

It is another object to provide a method and apparatus for mitigating surface height errors on a multilayer coating used for EUVL.

These and other objects will be apparent to those skilled in the art based on the disclosure herein.

The purpose of this invention is to correct figure (shape) errors on optical or other precision surfaces by changing the local density (or specific volume) of material in a zone at or near the surface. The height of the optical surface is correlated closely with the localized density of the material within the same region. Thus, a change in the height of the optical surface can then be caused by a change in the localized density of the material at or near the surface. A measured distribution of height errors would be analyzed and converted to a desired variation in density of the material over the surface that would cause the respective heights of the surface to expand or contract in order for the surface to assume the correct height distribution. The localized change in density might be caused by any of several physical mechanisms, such as the compaction or expansion of a surface layer caused by exposure to a localized dose of laser radiation; another mechanism might include the chemical reaction of a surface layer caused by a localized dose of directed energy that yields a different density; another example is the change in density that might result from ion implantation. The directed energy may be from any of several sources, such as from thermal radiation provided by illumination from an infrared laser, or from energy deposited by ion or electron beam bombardment. Ion implantation would lead to additional atoms or ions being embedded within the surface layer of the optic. The localized region for applying the height correction might be spatially broad, as might be appropriate for correcting low frequency figure errors on an optical surface, such as astigmatism, or may be much narrower, as may be needed for correcting millimeter-dimension waviness. One application that motivates this invention is in correcting waviness errors on optical surfaces with spatial periods ranging from 0.5 mm to 10 mm although another particular embodiment might be used for correcting a wider band of spatial periods.

DETAILED DESCRIPTION OF THE PREFERRED EMBODIMENTS

Figure 1:
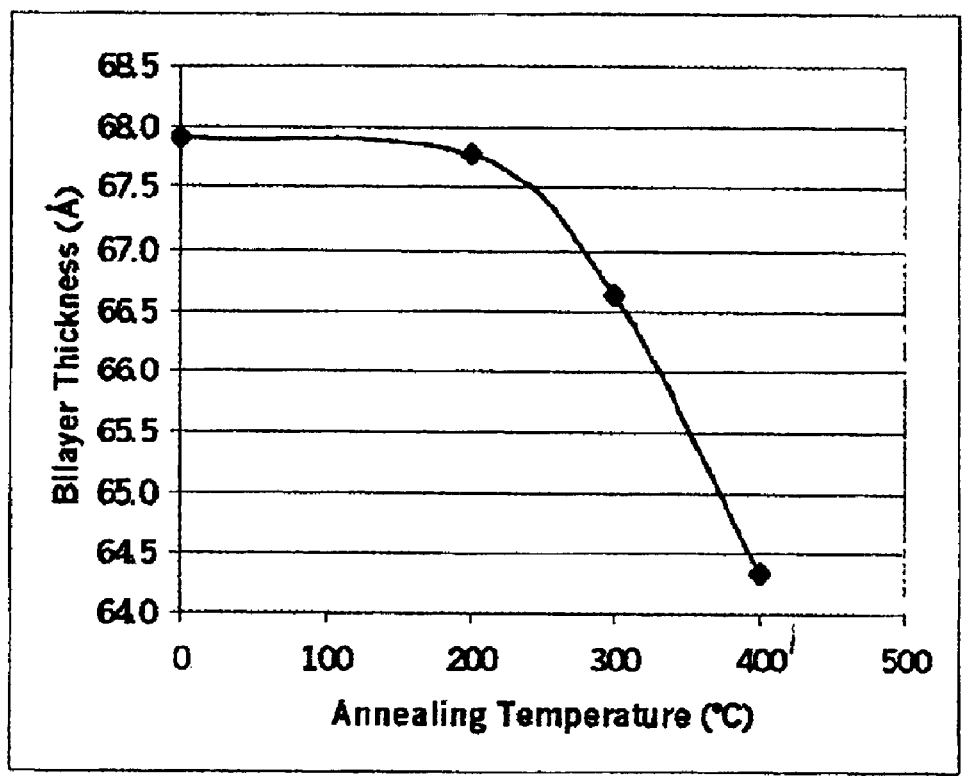
FIG. 1 shows experimental data illustrating that the layer thickness of Mo/Si multilayers can be changed by changing the annealing temperature.

The current invention comprises the idea of correcting the shape of a precision surface, such as a reflective optical surface, by locally raising or lowering the surface by changing the local density of the material at the surface. Multilayer coatings, typically alternating layers of molybdenum and silicon (Mo/Si) are deposited upon well-polished substrates (such as a glass or glass-ceramic) to obtain increased reflectance of EUV or x-ray light. The reflectance of the multilayers is very dependent upon the control of the thickness of each of the layers of the deposited material. For a given angle, the multilayer will reflect at a given wavelength. For another angle, it will be another wavelength. Optical designs prescribe reflectance at the optical surfaces with various angle ranges, requiring the layer thickness to be graded to preserve reflectance at a specific angle.

The average thickness of the Mo/Si coating can be controlled over large substrates to tolerances of <0.1 nm rms. This tolerance on thickness is within the envelope of the control of the surface shape that is required for the control of figure errors—which must be true if the coatings are to retain the accuracy of the polished surface.

It was experimentally observed during the annealing of the Mo/Si multilayers that the wavelength of light that is optimally reflected from the surface changes if the multilayer is subjected to a post-deposition annealing process. This wavelength shift is caused by changes in the thicknesses of the individual layers. A direct consequence of the change in layer thickness is that the overall thickness of the multilayer coating has changed; the change in coating thickness correlates to a change in average density of the coating, since matter is neither added nor removed in this process. This controlled observation of coating thickness changes thus leads to the idea that a controlled, localized thermal treatment of a multilayer coating could be used to control the height or figure of an optical surface.

Initial data that illustrates this effect is given in FIG. 1, which shows the average thickness of a single Mo/Si bilayer versus annealing temperature. The Mo/Si multilayer used for collecting the data in Figure consisted in an alternance of Mo layers and Si layers of about 2.8 nm and 4.0 nm, respectively. Each pair of Mo and Si layer is called a bilayer herein, and is about 6.8 nm thick. A key point illustrated by this plot is that a Mo/Si bilayer changes its thickness by about 0.35 nm (3.5 Å) for a 400° C. treatment. This result is given in terms of a single bilayer; a value for multiple bilayers would be obtained by multiplying by the number of bilayers. In the current example, a ten bilayer stack would change thickness by about 3.5 nm. This indicates a high degree of controllability for the process.

There are multiple ways of generalizing the concept of using multilayers for controlling the height of a surface. The process could involve the use of other coating materials and or multilayer pairs, as long as they showed a thickness correlation with temperature. FIG. 1 provides an example of multilayer contraction (thickness reduction) by heat. There exist ML systems, such as Ta2O5/SiO2, that expand (thickness increase) with heat.

The functional requirement for altering the figure of an optical surface is that the thickness of the surface layer would change. For thermal treatment of multilayer coatings, the thickness change also corresponds to a density change. However, this general concept might be generalized for any materials process that exhibits a thickness change as a function of density change. Changing the density of the surface layer(s) might be accomplished by several methods, such as by implanting additional material (atoms, molecules, ions) into the surface by ion implantation, compaction, chemical diffusion, or chemical reaction.

Once a process is identified showing a correlation between thickness (or density) and treatment, there is potentially a multitude of means of controlling the location of the concomitant surface height change. This could be accomplished by controlling the spatial region over which heat is deposited to the Mo/Si multilayer, such as by guiding a focused laser beam to selectively deposit infrared energy to the surface. Also, heat might be deposited by focusing an electron or ion beam onto the surface. A broad energy source might also illuminate a mask that only transmits energy to the surface by means of a spatial distribution of "holes" or regions of varying transmission.

It has been observed that silicon dioxide is compacted due to exposure to ultraviolet light. This compaction correlates with a change in surface height. Thus the controlled UV irradiation of a coating of silicon dioxide offers another means of causing surface height modifications.

One embodiment of this invention is in the correction of height errors within discretized regions referred to here as pixels. The overall lateral extent of an optical surface would comprise a continuous field of neighboring pixels. The correction of height errors spanning the overall surface would be the summed contribution from the height corrections applied to the individual pixels. The corrections applied to the individual pixels might be considered independent or may be coupled as in the concept of a convolution process. In general, a pixel is the smallest spatial region over which a local correction is performed. For example, for spatial periods of 0.5–10.0 mm, a pixel might be defined as having a lateral dimension of about 0.5 mm.

An example of applying the invention might begin with first measuring the height errors of the surface using an interferometer. The height errors would then be apportioned to each pixel in the pixel coordinate system. For this example, the surface might then be coated with a material that has the characteristic of having a density that can be varied by the application of energy, such as the dependence of the density of Mo/Si multilayers upon the application of thermal energy. From the measured height errors, a desired density change can then be calculated for each pixel. From knowledge of how the density of the Mo/Si layer varies with deposited energy, a dose of thermal radiation could then be assigned to each pixel. Then, an infrared laser or other source of thermal radiation could be directed to each pixel, perhaps as with a single pulse, or a series of pulses. The beam size incident on the pixel would be chosen so that the lateral extent of the density change is commensurate with the size of the pixel and the thermal properties of the material. For example, the FWHM of a gaussian intensity profile might be chosen to be about 0.5 mm. The laser is then sequentially directed to each pixel on the surface, stopping at each pixel while depositing the desired energy. Upon the deposition of energy at each pixel, the localized density of the surface material corresponding to each pixel is changed. The change in localized density results in changing the local height of the optical surface and thus removing the shape error of the optical surface. Alternatively, the laser beam might be continuously raster-scanned over the field of pixels where the scan speed is varied so that the dwell time of the beam is inversely proportional to the desired energy deposition.

After each pixel on the optical surface has been addressed and the optic has achieved thermal equilibrium, another measurement of the residual errors could be performed. Although it may be a goal of this invention to remove all errors during one operation, it may be necessary to address residual errors. Depending upon the specific properties of the surface material, e.g., Mo/Si, another iteration of correction could be applied, or, if necessary, additional coating layers could be added for further correction. It might also be desirable to perform a sequence of correction operations, where different size pixels are used for each iteration.

The original reason that multilayer deposition was employed on optical surfaces was to enhance reflectance. The multilayers described for this invention should not be confused with multilayers used for attaining reflectance. It would be the intent that after the processing was complete for correction of surface figure errors, that another set of multilayers would be deposited upon the surface for optimizing reflectance. The design of the first set of multilayers would be optimized for thickness modification, while the top layer of multilayers would be optimized for reflectance.

In general, multilayers exhibit a residual stress when deposited. The stress distribution within the multilayers is relatively uniform across a surface after deposition. The thermal treatment of the coating to cause a thickness variation may change the stress distribution across the coating. This added effect may influence the shape of the optical surface. For accurately predicting the influence of the thermal treatment of the coating upon the shape of the optic, it is necessary to consider or address the influence of the stress upon shape. For example, the distribution of the thermal treatment, e.g., maximum temperature, should be optimized with respect to both stress and thickness changes. An alternate approach is to select coating materials that minimize the dependence of stress in comparison to the thickness change.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method for correcting height errors on a substrate, comprising altering the density of a region selected from the group consisting of at least a portion of said substrate and at least a portion of a coating on said substrate, wherein an expansion or contraction of said region is produced such that the height of said region changes by an amount needed to mitigate surface height error.

2. The method of claim 1, wherein said coating comprises a multilayer.

3. The method of claim 2, wherein said multilayer comprises a Mo/Si multilayer.

4. The method of claim 2, wherein said expansion or contraction results from a reaction selected from the group consisting of (i) interdiffusion and (ii) a chemical reaction of neighboring layers of said multilayer, wherein said reaction results in a net change in density, which results in a change in height of a surface of at least one layer of said multilayer.

5. The method of claim 1, wherein the step of altering the density of a region includes depositing energy into said region.

6. The method of claim 1, wherein the step of altering the density of a region includes depositing thermal energy into said region.

7. The method of claim 6, wherein the step of depositing thermal energy includes depositing laser energy.

8. The method of claim 6, wherein the step of depositing thermal energy includes bombarding said region with an electron beam.

9. The method of claim 6, wherein the step of depositing thermal energy includes bombarding said region with an ion beam.

10. The method of claim 1, wherein the step of altering the density comprises bombarding said region with atoms.

11. The method of claim 7, wherein the step of depositing laser energy is carried out with an excimer laser.

12. The method of claim 1, wherein expansion or contraction of said region is localized to at least one area delineated by spatial extent.

13. The method of claim 12, wherein said at least one area comprises pixels.

14. The method of claim 1, wherein the step of altering the density of a region is controlled as a function of time.

15. The method of claim 6, wherein the step of depositing thermal energy is controlled as a function of time wherein a desired height change is proportional to the duration of the step of depositing thermal energy.

16. The method of claim 5, wherein the step of altering the density of a region is controlled as a function of the intensity of energy deposited into said region.

17. The method of claim 13, wherein said pixels comprise an abrupt spatial boundary.

18. The method of claim 17, wherein said abrupt spatial boundary comprises a geometric shape.

19. The method of claim 13, wherein said pixels comprise a non-abrupt spatial boundary.

\* \* \* \* \*